United States Patent [19]

Rogers et al.

[11] Patent Number: 4,630,357
[45] Date of Patent: Dec. 23, 1986

[54] METHOD FOR FORMING IMPROVED CONTACTS BETWEEN INTERCONNECT LAYERS OF AN INTEGRATED CIRCUIT

[75] Inventors: Steven H. Rogers, Midwest City, Okla.; Thomas J. Hwang, Fremont, Calif.

[73] Assignee: NCR Corporation, Dayton, Ohio

[21] Appl. No.: 761,945

[22] Filed: Aug. 2, 1985

[51] Int. Cl.⁴ .................. H01L 21/285; H01L 21/88
[52] U.S. Cl. ........................ 29/590; 29/591; 29/589; 29/577 C
[58] Field of Search .............. 29/590, 591, 589, 578, 29/571; 148/DIG. 147; 357/65, 67, 71; 427/88, 91, 95; 29/577 C; 156/662, 665

[56] References Cited

U.S. PATENT DOCUMENTS

| | | | |
|---|---|---|---|
| 4,152,823 | 5/1979 | Hall | 29/571 |
| 4,330,931 | 5/1982 | Liu | 29/571 |
| 4,343,676 | 8/1982 | Tarng | 156/628 |
| 4,441,247 | 4/1984 | Gargini et al. | 29/571 |
| 4,503,601 | 3/1985 | Chiao | 29/571 |
| 4,507,853 | 4/1985 | McDavid | 29/591 |
| 4,517,225 | 5/1985 | Broadbent | 427/89 |
| 4,528,744 | 7/1985 | Shibata | 29/571 |
| 4,532,702 | 8/1985 | Gigante et al. | 29/578 |
| 4,540,607 | 9/1985 | Tsao | 427/253 |
| 4,562,640 | 1/1986 | Widmann et al. | 29/591 |

OTHER PUBLICATIONS

Shaw et al, "Vapor-Deposited Tungsten as a Metallization and Interconnection Material", RCA Review Jun. 1970, p. 307+.
Tsao et al, "LPCVD of Tungsten on Polycrystalline", J. Electrochem. Soc.: Solid-State Science and Technology, Nov. 1984, p. 2702+.
Moriya et al, "A Planar Metallization Process–Its Application to Tri-Level Aluminum Interconnection", IEDM 83 25.3, p 550+.
Metz et al, "Electrical Properties of Selectively Deposited Tungsten Thin Films", Appl. Phys. Lett 44 (12), 15 Jun. 1984, p. 1139+.

*Primary Examiner*—Brian E. Hearn
*Assistant Examiner*—Tuan N. Quach
*Attorney, Agent, or Firm*—Wilbert Hawk, Jr.; Casimer K. Salys

[57] ABSTRACT

A method of forming improved contacts between interconnect layers of an integrated circuit including sputter depositing a metallic lower layer of interconnect material on a target, and patterning the layer of interconnect material to form an interconnect layer. A dielectric layer is then deposited over the interconnect layer, and via holes are formed through the dielectric layer. A polysilicon layer is deposited over the dielectric layer, including the side walls and bottom of the via holes, and then removed from the dielectric layer and the bottom of the via holes, by anisotropic etching, leaving polysilicon on the side walls. Tungsten is then selectively deposited on the bottom and side walls of the via holes forming metal plugs therein, and a second layer of interconnect material is sputter deposited over the dielectric layer and the metal plugs in the via holes thereby forming contacts between the first and second layers of interconnect material.

11 Claims, 6 Drawing Figures

METHOD FOR FORMING IMPROVED CONTACTS BETWEEN INTERCONNECT LAYERS OF AN INTEGRATED CIRCUIT

BACKGROUND OF THE INVENTION

The present invention is related to the forming of improved contacts between interconnect layers in integrated circuits and is particularly useful in the production of very large scale integrated circuits.

Contact between metal interconnect layers in multilayer integrated circuits is provided by via holes through a dielectric layer between the metal interconnect layers. Sputter deposited aluminum is the most commonly used interconnect material; however, the sputtering technique does not provide completely conformal step coverage, to include the steps which comprise vias holes. The sputtered film will typically be thinner on vertical surfaces than it is on horizontal surfaces. This is particularly true where the steps have steep vertical slopes or negative slopes. Electromigration of the metal atoms under the influence of electric current may form voids in the thinner portions of the metal film to the point that an open occurs and the via contact can no longer carry current. The electromigration phenomenon increases with current density and temperature, and its effects are cumulative.

When there is a high aspect ratio between the thickness of the dielectric layers to the diameter of the via holes, metal sputter deposited over the dielectric layers collects around the upper edges of the via holes, choking off the via holes such that metal cannot enter the via hole to completely form a via contact having electrical integrity through the dielectric layer from the upper metal interconnect layer to the lower metal interconnect layer. This condition is referred herein as a re-entrant condition. This re-entrant condition becomes more serious as relatively thicker dielectric layers and smaller diameter via holes become more common to limit electrical interference between layers in multilayer integrated circuit chips.

In the paper "A Planar Metallization Process—Its Application to Tri-level Aluminum Interconnection" by T. Moriya et al., pages 550–553, IEDM83, a method of refilling via holes with tungsten by selective chemical vapor deposition is discussed. Among other substrate materials, tungsten is deposited on aluminum and aluminum-silicon alloy having 1% silicon. It is noted at page 551 of the article that in the case of tungsten deposited directly on an aluminum-silicon alloy, flourine is observed to pile up at the interface making the contact resistivity relatively high considering the metal-to-metal structure. This high resistivity is not desirable in the forming of interlayer contacts. To reduce the contact resistivity in the disclosed process, a thin layer of $MoSi_2$ is sputter deposited on top of the AlSi alloy before the interlayer insulator deposition.

In the article "Refractory Metal Silicides: Thin-Film Properties and Processing Technology", T. Paul Chow et al, IEEE Transactions on Electron Devices, Vol. ED-30, No. 11, November 1983, at page 1486, the deposition of metal over silicon areas suitable in VLSI technology is suggested.

In a paper entitled "Low Pressure Chemical Vapor Deposition of Metals and Their Application in VLSI Technology" by Eliot K. Broadbent, presented at the Electrochemical Society Meeting, Washington, D.C., Oct. 9–14, 1983, the author discussed selective CVD tungsten via/contact filling wherein via holes through an oxide layer is filled by the selective chemical vapor deposition of tungsten.

In an abstract titled "Tungsten Selective Deposition Part 2: Tungsten Selective Self-Alignment Gate Technology" by P. A. Gargini et al., Abstract No. 381, ECS Fall 1981, the forming of a gate structure utilizing a low resistance tungsten film on top of polysilicon is discussed.

U.S. Pat. No. 3,632,436 issued Jan. 4, 1972 to Denning for "Contact System for Semiconductor Devices" discloses a method for forming a nickel-lead contact system which includes depositing a thin film of nickel electrolessly on a silicon layer, but not on an underlaying oxide layer.

In U.S. Pat. No. 4,330,931 issued May 25, 1982 to Liu for "Process for Forming Metal Plated Regions and Lines in MOS Circuits" a process for forming self-aligned, metal plated substrate regions and polysilicon members is described in which a tungsten deposition is used to form metal plating over exposed substrate regions and over a polysilicon member, with no metal being formed over adjacent oxide lips.

U.S. Pat. No. 4,507,853 issued Apr. 2, 1985 to McDavid for "Metallization Process for Integrated Circuits" discloses metal contacts and interconnections for semiconductor integrated circuits formed by a two metal deposition process. A first metal layer is deposited over a step or the sidewalls of an aperture, and then a preferential etch removes all of the first metal layer except on the vertical side of the step or aperture. Silicon exposed at the bottom of the aperture is used as an etch stop. A second layer of metal is deposited over the integrated circuit, including the remaining parts of the first metal layer, in gross, and not selectively.

U.S. Patents which show the state of the art include: U.S. Pat. No. 3,653,120 issued Apr. 4, 1972 to Sirrine et al. for "Method of Making Low Resistance Polycrystalline Silicon Contacts to Buried Collector Regions Using Refractory Metal Silicides"; U.S. Pat. No. 3,887,993 issued June 10, 1975 to Okada et al. for "Method of Making an Ohmic Contact with a Semiconductor Substrate"; U.S. Pat. No. 4,248,688 issued Feb. 3, 1981 to Gartner et al. for "Ion Milling of Thin Metal Films"; U.S. Pat. No. 4,259,680 issued Mar. 31, 1981 to Lepselter et al. for "High Speed Lateral Bipolar Transistor"; U.S. Pat. No. 4,267,012 issued May 12, 1981 to Pierce et al. for "Process for Patterning Metal Connections On A Semiconductor Structure by Using a Tungsten-Titanium Etch Resistant Layer"; U.S. Pat. No. 4,273,859 issued June 16, 1981 to Mones et al. for "Method of Forming Solder Bump Terminals on Semiconductor Elements"; U.S. Pat. No. 4,329,706 issued May 11, 1982 to Crowder et al. for "Doped Polysilicon Silicide Semiconductor Integrated Circuit Interconnections"; U.S. Pat. No. 4,356,622 issued Nov. 2, 1982 to Widmann for "Method of Producing Low-Resistance Diffused Regions in IC MOS Semiconductor Circuits In Silicon-Gate Technology Metal Silicide Layer Formation"; U.S. Pat. No. 4,358,891 issued Nov. 16, 1982 to Roesner for "Method of Forming A Metal Semiconductor Field Effect Transistor"; and U.S. Pat. No. 4,374,700 issued Feb. 22, 1983 to Scott et al for "Method of Manufacturing Silicide Contacts for CMOS Devices".

SUMMARY OF THE INVENTION

In a specific embodiment, a method of forming improved contacts with a metallic lower layer of an integrated circuit is described which comprises depositing a dielectric layer over the metallic lower layer; forming an opening through the dielectric layer; conformally depositing a layer of a first material over the dielectric layer; removing the first material from horizontal surfaces of the dielectric layer; selectively forming a metallic layer on the non-horizontal walls of the opening by reaction with retained first material; and forming a metallic second layer over the dielectric layer and the metallic layer in the opening.

It is thus a primary object of the invention to provide a method for forming improved contacts between interconnect layers of multilayer integrated circuits using selective deposition of tungsten in via holes.

It is another object of the present invention to provide improved metal coverage of steps, to include steps which comprise via holes.

It is another object of the present invention to provide a process for fabricating interlayer contacts which includes the step of depositing polysilicon on the sides of via holes through the interlayer dielectric, and selectively depositing on the polysilicon, a layer of tungsten for forming an interlayer contact.

These and other objects of the present invention will become apparent from the drawings and preferred embodiment disclosed herein.

DESCRIPTION OF THE PREFERRED EMBODIMENTS

Figure 1:
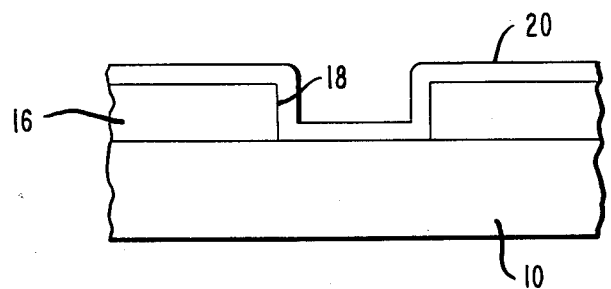
FIG. 1 is a cross sectional view of a lower metal interconnect layer, on which is deposited a dielectric having a via hole and a layer of polysilicon deposited thereover.

FIG. 1 shows a lower metal layer 10 to which an electrical connection with an upper metal layer is desired, such as in a multi-layer high density VLSI device. The lower metal layer 10 is deposited in the normal manner, typically by sputtering aluminum or an aluminum alloy from a target to produce a film with a typical thickness of from 400 to 1000 nanometers. The lower metal layer 10 is patterned with conventional masking and lithographic techniques, and etched using reactive ion or plasma etching to form an interconnect pattern, as desired. After the etching process, the masking is removed by wet solvent stripping or plasma etching.

An intermetal dielectric layer 16, typically silicon dioxide, is deposited over the lower metal layer 10, typically by chemical vapor deposition or plasma enhanced chemical vapor deposition to a typical thickness of one micrometer. However, depending on the application, the thickness of the dielectric layer 16 may range from 600 to 1500 nanometers thick. Via holes, one of which is shown at 18, are formed by using conventional lithography to include photo, x-ray, ion beam, or electron beam lithography, and are anisotropically etched using plasma or reactive ion etching techniques.

After the via hole 18 is formed through the dielectric layer 16, the masking material is removed by wet solvent stripping or plasma etching, and a conformal polysilicon layer 20 is deposited over the dielectric layer 16. The polysilicon is deposited by the low pressure chemical vapor deposition process at a temperature of about 600° C., a pressure of about 300 millitorr, and in an ambient gas of a mixture of $SiH_4$ and hydrogen. The deposited polysilicon has a thickness greater than 25 nanometers, with the preferred target thickness being about 50 nanometers. It will be noted that the conformal polysilicon layer 20 completely covers the steps which comprise the via hole 18 such that the side walls of the via hole 18 are completely covered by polysilicon.

Figure 2:
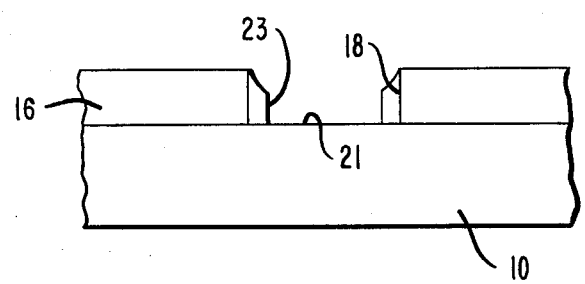
FIG. 2 is a cross sectional view of the layers of FIG. 1 with the upper layer of polysilicon removed except for the side walls of the via hole.
Figure 3:
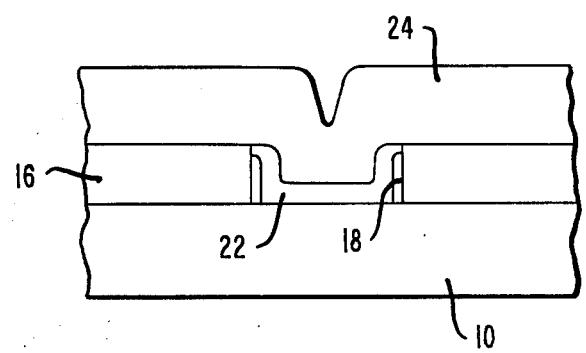
FIG. 3 is a cross sectional view of the completed multilayer construction formed in accordance with the invention.

Referring to FIG. 2, that portion of the polysilicon layer 20 on the exposed horizontal surfaces to include the top of the dielectric 16 and the bottom 21 of the via hole 18, is then removed by anisotropic etching, leaving only a portion 23 of the polysilicon layer 20 on the walls of the via hole 18. In the embodiment of FIGS. 1–3, the anisotropic etching process removes the layer 20 over the bottom 21 of the via hole 18 such that the underlying metal layer 10 is exposed.

Referring to FIG. 3, a tungsten plug 22 is formed by selective deposition by the chemical vapor deposition process, on the exposed polysilicon 23 on the walls of the via hole 18, and over the exposed metal layer 10 forming the bottom 21 of the via hole 18. The selective deposition of the tungsten consumes a portion of the silicon, in the order of 25 nanometers, so that at the completion of the plug fabrication process, the tungsten relatively evenly covers the walls and the bottom of the via hole 18 leaving no voids. As is known, the selective deposition of the tungsten is a self-limiting process, such that a layer of tungsten over the bottom 21 and the sides of the via hole 18 is formed, many times without completely filling the via hole 18. As previously mentioned, a portion of the polysilicon is consumed by its combination with fluorine used in the chemical vapor deposition process, and is dissipated as $S_iF_4$ gas. As the tungsten layer 23 on the side walls of the via hole 18 is accomplished by chemical vapor deposition, the described re-entrant condition is also reduced or avoided.

An upper metal layer 24 is then deposited over the dielectric layer 16 and the tungsten plug 22 by the sputtering technique previously described. The described process may then be repeated for the adding of a second dielectric layer and a third layer of metallization.

Figure 4:
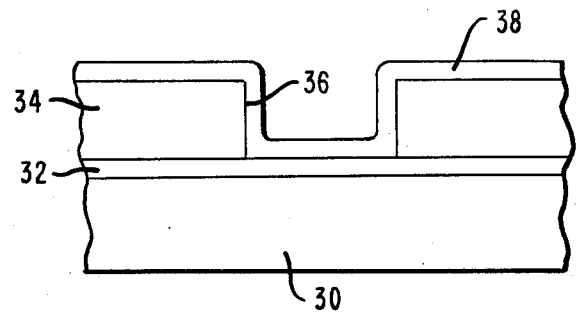
FIG. 4 is a cross sectional view of a second embodiment having a lower metal interconnect layer, a dielectric layer having a via hole therethrough, a silicon buffer layer between the metal interconnect layer and the dielectric layer, and a layer of polysilicon deposited over the dielectric layer.
Figure 5:
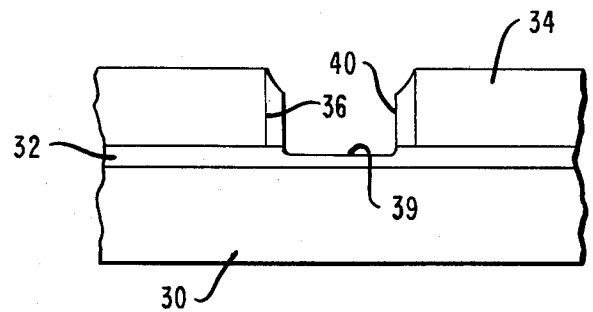
FIG. 5 is a cross sectional view of the embodiment of FIG. 4 with the upper layer of polysilicon removed except for the side walls of the via hole.
Figure 6:
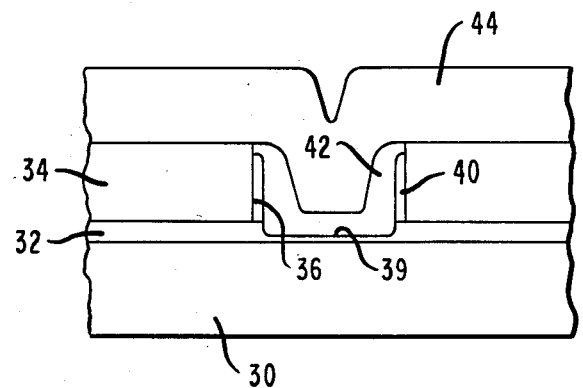
FIG. 6 is a cross sectional view of the completed multilayer construction of the embodiment of FIG. 4.

As discussed in the aforementioned T. Moriya et al. article, chemical vapor deposition of tungsten on aluminum may result in relatively high contact resistivity at the metal-to-metal, tungsten-to-aluminum interface. FIGS. 4–6 illustrate another embodiment of the invention, similar to the first embodiment, wherein a buffer layer 32 is deposited between a lower metal layer 30 and an overlaying dielectric layer 43.

Referring to FIG. 4, a lower metal layer 30 is sputter deposited in the same manner as the metal layer 10 of FIGS. 1-3. An undoped, amorphous or polycrystalline silicon film buffer layer 32 is deposited by the chemical vapor deposition process to a thickness of about 50 to about 150 nanometers, with 150 nanometers being preferred. A dielectric layer 34, a via hole 36 and a conformal polysilicon layer 38, equivalent to the dielectric layer 16, via hole 18 and conformal polysilicon layer 20 respectively of FIGS. 1-3, are then formed as previously described.

Referring to FIG. 5, that portion of the polysilicon layer 38 on the horizontal surfaces of the dielectric layer is removed by anistropic etching. The thickness of the buffer layer 32 and the anistropic etching are controlled such that a layer of the silicon buffer 32 greater than 25 nanometers thick remains over the lower metal layer 30 at the bottom 39 of the via hole 36 after the anistropic etching process. A portion 40 of the polysilicon layer 38 on the side walls of the via hole 36 also remains after the anistropic etching.

Tungsten 42 is selectively deposited by chemical vapor deposition over the polysilicon portion 40 on the side walls and the silicon buffer 32 on the bottom 39 of the via hole to form a via plug. As previously mentioned, the plug fabrication consumes about 25 nanometers of the silicon on the side walls and the bottom 39 of the via hole 36. As previously mentioned, the silicon layer 32 left on the bottom 39 of the via hole 36 is greater than 25 nanometers, so that at the end of the tungsten plug fabrication, a thin layer of silicon buffer 32 remains between the tungsten 42 and the lower metal layer 30. This prevents the pile up of fluorine mentioned in the T. Moriya et al. article, thereby preventing the relatively high resistivity resulting therefrom. An upper metal layer 44 is then sputter deposited over the dielectric layer 34 and the tungsten 42 forming a via contact in the via hole 36. The aluminum layers 30 and 44 are then sintered in the conventional manner. During this sintering process, the aluminum of layer 30 spikes through the remaining amorphous or polycrystalline silicon buffer layer 32 at the bottom 39 of the via hole 36, to form an electrical conducting contact between the aluminum layer 30 and the tungsten 42.

The portion of the buffer layer 32 remaining at the bottom 39 of the via hole 36 may also be made thin enough by the described anisotropic etching step that the remaining buffer layer 32 will be completely consumed during the chemical vapor deposition of the tungsten layer 42 forming a tungsten-to-aluminum interface at the bottom 39 of the via hole 36, but which is thick enough so that fluorine build-up at the tungsten-to-aluminum interface after the complete consumption of that portion of the buffer layer 32 at the bottom 39 of the via hole 36 is minimized.

Thus, a process has been described which provides the aforementioned objects. It will be understood by those skilled in the art that the disclosed embodiments are exemplary only, and that various steps and techniques disclosed may be replaced by equivalents without departing from the invention hereof, which equivalents are intended to be covered by the appended claims.

What is claimed is:

1. A method of forming improved contacts with a metallic lower layer of an integrated circuit comprising:

depositing a dielectric layer over said metallic lower layer;

forming an opening through said dielectric layer;

conformally depositing a layer of a first material of silicon over said dielectric layer;

removing said first material from horizontal surfaces of said dielectric layer;

selectively forming a refractory metal layer on the non-horizontal walls of the opening by reaction with retained first material; and forming a metallic second layer over said dielectric layer and said refractory metal layer in said opening.

2. The method of claim 1 wherein said dielectric layer is formed of silicon dioxide.

3. The method of claim 1 wherein said first material is polysilicon deposited by chemical vapor deposition.

4. The method of claim 3 wherein the layer of said first material deposited over said dielectric layer is greater than 25 nanometers thick.

5. The method of claim 4 wherein said removing of said first material is accomplished by anisotropic etching.

6. The method of claim 5 wherein said forming of said refractory metal layer on the non-horizontal walls of the opening is accomplished by chemical vapor deposition.

7. The method of claim 6 wherein said refractory metal layer formed on the non-horizontal walls of the opening is of tungsten.

8. A method of forming improved contacts with a refractory metal lower layer of an integrated circuit comprising:

depositing a buffer layer of silicon material over said refractory metal lower layer;

depositing a dielectric layer over said buffer layer;

forming an opening through said dielectric layer having vertical side walls and a horizontal bottom formed of a portion of said buffer layer;

conformally depositing a layer of a first material of silicon over said dielectric layer, including said vertical side walls, and said horizontal bottom;

removing said first material of silicon from exposed horizontal surfaces of said dielectric layer and from said horizontal bottom, leaving at least a portion of said buffer layer over the bottom of said opening;

selectively forming a refractory metal first layer in said opening by reaction with retained first material on said vertical side walls and said buffer layer portion covering the bottom of said opening; and forming a metallic second layer over said dielectric layer and said refractory metal first layer in said opening.

9. The method of claim 8 wherein said buffer layer is selected from one of undoped, amorphous and polycrystalline silicon, and is deposited by chemical vapor deposition.

10. The method of claim 9 wherein said portion of said buffer layer covering the bottom of said opening after the removal of said first material of silicon is at least 25 nanometers thick.

11. The method of claim 10 wherein, after the forming of said refractory metal first layer in said opening, at least a fractional portion of said buffer layer remains between said refractory metal first layer in said opening and said refractory metal lower layer.

* * * * *